US007479850B2

(12) United States Patent
Kearns et al.

(10) Patent No.: US 7,479,850 B2
(45) Date of Patent: Jan. 20, 2009

(54) MINIATURISED HALF-WAVE BALUN

(75) Inventors: Brian Kearns, Dublin (IE); William Verner, Belfast (GB)

(73) Assignee: TDK Corporation, Tokyo (JP)

( * ) Notice: Subject to any disclaimer, the term of this patent is extended or adjusted under 35 U.S.C. 154(b) by 312 days.

(21) Appl. No.: 11/397,860

(22) Filed: Apr. 5, 2006

(65) Prior Publication Data

US 2007/0236306 A1 Oct. 11, 2007

(51) Int. Cl.
*H01P 5/10* (2006.01)
*H03H 7/38* (2006.01)
*H03H 9/58* (2006.01)
*H03H 5/00* (2006.01)

(52) U.S. Cl. ....................... 333/189; 333/204; 333/190; 333/193; 333/26

(58) Field of Classification Search .................. 333/26, 333/33, 35, 128, 204, 189, 190, 193
See application file for complete search history.

(56) References Cited

U.S. PATENT DOCUMENTS 5,574,411 A 11/1996 Apel et al.
5,644,272 A * 7/1997 Dabrowski .................. 333/26
6,150,897 A 11/2000 Nishikawa et al.
6,535,077 B1 * 3/2003 Hiroshima et al. ............ 333/26
7,199,684 B2 * 4/2007 Aigner et al. ............... 333/189
2003/0102937 A1 6/2003 Hiroshima et al.
2003/0112768 A1 * 6/2003 Frank ......................... 370/281
2004/0095212 A1 * 5/2004 Iwasaki et al. ................ 333/26
2004/0164817 A1 8/2004 Nosaka

FOREIGN PATENT DOCUMENTS

EP 0 869 574 A2 10/1998
EP 1 345 323 A1 9/2003

* cited by examiner

*Primary Examiner*—Robert Pascal
*Assistant Examiner*—Gerald Stevens
(74) *Attorney, Agent, or Firm*—Oliff & Berridge, PLC

(57) ABSTRACT

A miniaturised half-wave balun comprises a single-ended I/O port comprising a first signal carrying terminal for connection to a source impedance and a differential I/O port comprising second and third signal carrying terminals for connection to a load impedance. First and second transmission line sections of equal length and characteristic impedance are connected together at a common end and at opposite ends to the second and third terminals. The first signal carrying terminal is coupled to the first transmission line section. The combined length of the first and second transmission line sections is substantially less than one half of the wavelength of an RF signal at the operating frequency. First and second loading shunt capacitors are connected to respective first and second transmission line sections. A shunt capacitive element is connected at the common end of the transmission line sections. The capacitance of the shunt capacitive element is chosen so that the common mode impedance of said differential I/O port at a selected frequency is substantially zero Ohms.

9 Claims, 13 Drawing Sheets

MINIATURISED HALF-WAVE BALUN

CROSS-REFERENCES

The present application is related to co-filed application Ser. No. 11/397,859 entitled "A Compact RF Circuit with High Common Mode Attenuation".

FIELD OF THE INVENTION

This invention relates to a miniaturised half-wave balun useful in the field of radio frequency (RF) devices, RF components and RF circuits, particularly where conversion of single-ended RF signals to differential RF signals or conversion of differential RF signals to single-ended RF signals is required.

BACKGROUND OF THE INVENTION

Conventional electronic circuits for RF and telecommunications applications comprise one or more input ports to which input RF signals of the electronic circuit are fed, and one or more output ports from which output RF signals of the electronic circuit are emitted. Single-ended input/output ports have a pair of connection terminals: a signal terminal and a ground terminal, where the input and output RF signals of the electronic circuit are carried on the signal terminal and where the ground terminal provides a reference against which the RF signal on the signal terminal is defined.

In RF and telecommunications applications it is sometimes preferable to employ electronic circuits where the input/output (hereinafter referred to as I/O) ports of the device comprise a pair of signal carrying terminals where each terminal carries part of an input or output electrical signal of the electronic circuit.

The pair of RF signals carried on each terminal described above can be individually referenced to ground, or can be described mathematically as a linear combination of two signals: a differential mode signal and a common mode signal. A differential mode signal is divided between two terminals so that the amplitude of the signal on each terminal is the same, and so that there is a phase difference of 180° between both signals; thus the two parts of a differential signal carried on a pair of terminals are out of phase. A common mode signal is divided across two terminals so that the amplitude of the signal on each terminal is the same, and so that both signals are in phase; thus the two parts of a common mode signal carried on a pair of terminals are identical.

RF circuits comprising a pair of signal carrying terminals for each I/O port of the circuit are usually designed to process differential signals and are usually referred to as differential circuits. Sometimes RF circuits comprising a pair of signal carrying terminals for each I/O port of the circuit are referred to as "balanced circuits".

Differential mode signals are less susceptible to noise than common mode signals and consequently circuits designed to accept differential mode signals are often preferred for applications where a very high signal to noise ration is required. However, it is sometimes more practical to realize a particular device in a single-ended topology (for example single-ended antennae are often preferred to balanced antennae). A device which can convert a single ended signal to a differential mode signal is referred to as a balun.

The simplest type of balun is the half-wave balun. FIG. 1 shows a prior art half-wave balun 10, comprising a single-ended I/O port P1, and a differential I/O port P2. The balun has an operating band characterized by a lower frequency limit $F_L$ and an upper frequency limit $F_U$. I/O port P1 comprises a signal carrying terminal T1, and I/O port P2 comprises a pair of signal carrying terminals T2 and T3. Signal carrying terminal T1 is connected to a circuit node 13, which is also connected to signal carrying terminal T2, and which is connected to signal carrying terminal T3 via a length of transmission line 14 with an electrical length E of 180° at the centre frequency of the operating band of the balun.

An RF signal which is incident on terminal T1 is divided into two parts with the same amplitude at circuit node 13, one part of the RF signal is fed directly to terminal T2 and another part of the RF signal is fed to terminal T3 via transmission line 14 so that the RF signals which are emitted at terminals T2 and T3 will have the same amplitude, and will have a phase difference of 180° at the centre of the operating band of the balun. Thus, it is apparent that the half-wave balun of FIG. 1 has the required properties, i.e. a single ended signal incident at I/O port P1 will be emitted as a differential mode signal from I/O port P2 and a differential mode signal incident at I/O port P2 will be emitted as a single ended signal from I/O port P1.

The half-wave balun of FIG. 1 has the drawback of being very large at the operating frequencies of typical commercial cellular and W-LAN applications. For example, at an operating frequency of 2.45 GHz, the centre of the band specified in IEEE 802.11b/g for W-LAN applications, a half wavelength transmission line will have a length of 61.22 mm in air and will have an electrical length given by the expression below for a transmission line fabricated in a dielectric material.

$$\frac{\lambda}{2}\Big|_{f=2.45\text{ GHz}} = \frac{61.22}{\sqrt{\varepsilon_r}}\text{ mm}$$

where $\in_r$ is the relative dielectric constant of the material.

Other balun designs have been proposed for applications requiring a compact solution.

FIG. 2 shows a Marchand balun with capacitive loading at the input and output terminals such as that disclosed in "*A semi-lumped balun fabricated by low temperature co-fired ceramic*"; Ching-Wen Tang, Chi-Yang Chang; 2002 IEEE MTT Symposium Digest, Volume: 3, pp: 2201-2204. A similar balun is disclosed in U.S. Pat. No. 6,483,415, "Multi-layer LC resonance balun", Tang. The Marchand balun 20 of FIG. 2 comprises a first pair of coupled transmission line sections 23A and 23B and a second pair of coupled transmission line sections 24A, 24B where each of transmission line sections 23A, 23B and 24A, 24B has substantially the same electrical length and where the even mode and odd mode impedances of first pair of coupled transmission line sections 23A and 23B are substantially the same as the even mode and odd mode impedances of second pair of coupled transmission line sections 24A and 24B. The Marchand balun 20 of FIG. 2 further comprises a single-ended I/O port P1 comprising a signal carrying terminal T1 connected to an end of coupled transmission line section 23A, and differential I/O port P2 comprising a pair of signal carrying terminals T2 and T3 connected to ends of coupled transmission line sections 23B and 24B as shown in FIG. 2. Loading capacitors 26, 27, 28 and 29 are also connected to ends of coupled transmission line sections 23A, 23B and 24A, 24B as shown in FIG. 2. The effect of loading capacitors 26, 27, 28 and 29 being to allow the use of coupled transmission line sections which have an electrical length E which is less than 90° at the centre of the operating band of the balun 20.

FIG. 3 shows an LC balun according to FIG. 1C of U.S. Pat. No. 5,949,299: "Multilayered balance-to-unbalance signal transformer", Harada. The LC balun 30 of FIG. 3 comprises inductor 34, capacitor 35, inductor 36 and capacitor 37 connected together at circuit nodes 33A, 33B and 33C as shown in FIG. 3. The LC balun 30 of FIG. 3 further comprises a single-ended I/O port P1 comprising a signal carrying terminal T1 connected to a first circuit node 33A, and differential I/O port P2 comprising a pair of signal carrying terminals T2 and T3 connected to second and third circuit nodes 33B and 33C respectively.

The LC balun 30 of FIG. 3 can be realized in a compact form, for example using a multilayer low temperature co-fired ceramic (LTCC) structure as described in Harada.

A procedure for the analysis of electronic circuits or devices comprising one or more differential I/O ports is outlined by D. E. Brockelman, W. R. Eisenstadt; "*Combined Differential and Common-Mode Scattering Parameters: Theory and Simulation*"; IEEE Transactions on Microwave Theory and Techniques, Vol. 43, No. 7, July 1995, pp 1530-1539. For a device with a single-ended I/O port and a differential I/O port the relevant parameters are:

$S_{DS21}$, the differential mode response at the differential port for a stimulus at the single-ended port;

$S_{CS21}$, the common mode response at the differential port for a stimulus at the single-ended port;

$S_{DD22}$, the differential mode reflection coefficient at the differential port for a differential mode stimulus at the differential port;

$S_{CC22}$, the common mode reflection coefficient at the differential port for a common mode stimulus at the differential port;

$S_{SS11}$, the single-ended reflection coefficient at the single ended port.

FIG. 4A shows typical through responses of the LC balun 30 of FIG. 3 where inductors 34 and 36 both have inductances of 0.65 nH, and where capacitors 35 and 37 both have capacitances of 6.5 pF. The balun is designed to convert a single ended signal to a differential mode signal within a passband from 2400 MHz to 2500 MHz in line with the IEEE 802.11b/g standard for W-LAN applications. It can be seen that the differential mode response of the LC balun 30 of FIG. 3 is excellent (offering very low insertion loss within the passband). The maximum value of the common mode response within the passband is −33 dB approx; this is an acceptable level, though ideally, for a balun, the common mode response would be lower.

FIG. 4B shows the through responses of the LC balun 30 of FIG. 3 over a wide frequency range and with the same parameters as FIG. 4A. It can be seen that the common mode response of the LC balun 30 of FIG. 3 increases monotonically with increasing frequency above the passband and increases monotonically with decreasing frequency below the passband. Consequently, the balun of FIG. 3 is unsuitable for applications where a high common mode signal level far outside the passband of the balun gives rise to problems in the circuitry to which the balun is connected.

Another drawback of the LC balun 30 of FIG. 3 is that it requires two inductors 34 and 36. Unfortunately, if the circuit is to be fabricated using LTCC materials with a high dielectric constant, the realization of high Q inductors is difficult, and the insertion loss of the circuit becomes high.

For example, multilayer LTCC substrates with a layer thickness of 40 μm and a dielectric constant of 75 are typical for RF applications at 2.45 GHz. The resulting capacitance between mutual windings of an inductor is sufficiently large to lower the self resonant frequency of the inductor to a frequency below 2.45 GHz.

A further drawback of the LC balun 30 of FIG. 3 is that a pair of bias-tee networks are required in order to apply a DC bias to signal carrying terminals T2 and T3 of I/O port P2.

SUMMARY OF THE INVENTION

The present invention provides a miniaturised half-wave balun according to claim 1.

An RF signal incident on the single ended port of the half-wave balun of the present invention and within the operating band is emitted from the differential I/O port so that the differential mode component of the signal is substantially greater than the common mode component of the signal.

The half-wave balun of the present invention is constructed using a combination of transmission lines and capacitors, and hence can be fabricated using a multilayer technology employing materials with a high dielectric constant.

Preferably, an RF signal incident on the single ended port of the half-wave balun of the present invention with a frequency which is at least twice the operating frequency of the balun of the present invention is emitted from the differential I/O port with a common mode component which is at least 14 dB lower in power than the incident signal.

Preferably, a DC bias which is applied at the signal carrying terminal of the single ended I/O port of the half-wave balun of the present invention is fed to both signal carrying terminals of the differential I/O port of the half-wave balun of the present invention.

Preferably, a DC bias can be fed to both signal carrying terminals of the differential I/O port of the half-wave balun of the present invention by the application of a DC bias to a single node of the half-wave balun of the present invention.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

In the accompanying FIGURES, the same labels are used to denote I/O ports and signal carrying terminals in line with the convention in RF circuitry nomenclature to number RF ports and terminals sequentially starting at one.

Figure 5:
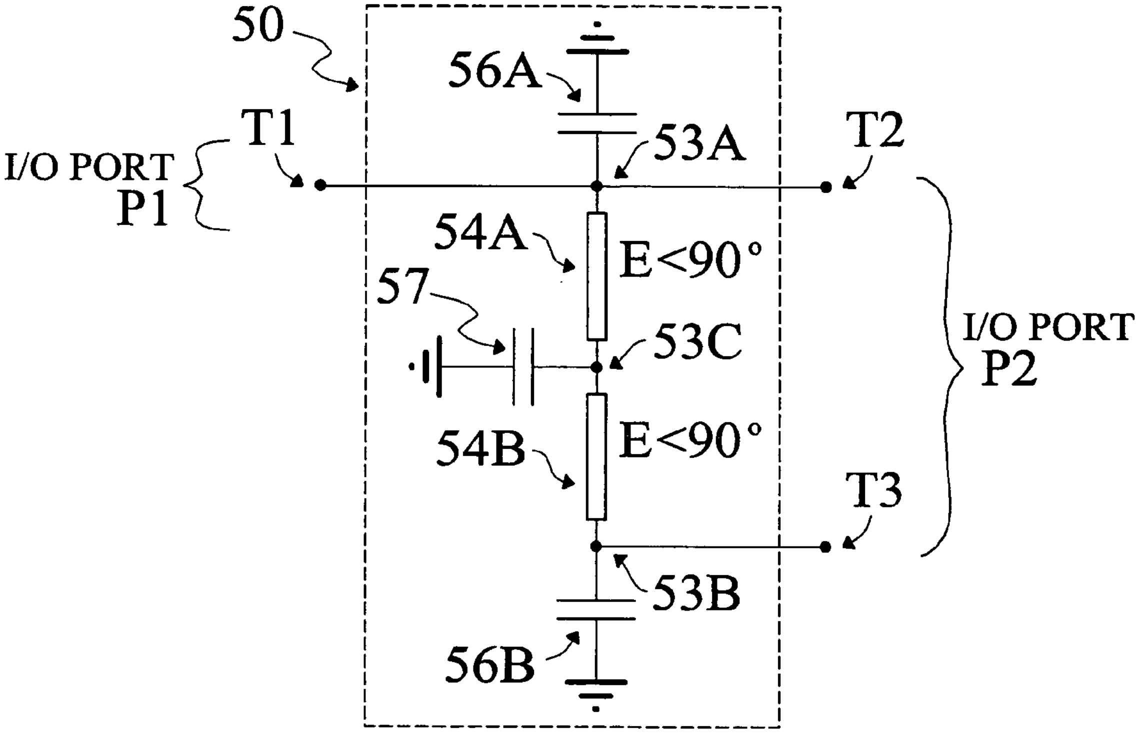
FIG. 5 shows a miniaturised half-wave balun according to a first embodiment of the present invention.

FIG. 5 shows a miniaturised half-wave balun 50 according to a first embodiment of the present invention. The half-wave balun 50 has a given operating band defined by a lower frequency limit $F_L$ and an upper frequency limit $F_U$. The half-wave balun 50 comprises a pair of transmission line sections 54A and 54B which have substantially identical physical properties and where each of transmission line sections 54A and 54B has an electrical length E which is substantially less than 90° at the centre of the operating band of the half-wave balun 50. A first end of transmission line section 54A is connected to a shunt capacitor 56A at a first circuit node 53A, a first end of transmission line section 54B is connected to a shunt capacitor 56B at a second circuit node 53B, second ends of transmission line sections 54A and 54B are connected together at a third circuit node 53C, and a shunt capacitor 57 is also connected to third circuit node 53C.

The miniaturised half-wave balun 50 of FIG. 5 further comprises a single-ended I/O port P1 comprising a signal carrying terminal T1 connected to first circuit node 53A, and differential I/O port P2 comprising a pair of signal carrying terminals T2 and T3 connected to first and second circuit nodes 53A and 53B respectively.

The capacitances of capacitors 56A and 56B are given by EQUATION 1 below.

$$C_{56A} = C_{56B} = \frac{1}{Z_0 \omega \tan\left(\frac{2\pi}{\lambda} L\right)} \qquad \text{EQUATION 1}$$

where $Z_0$ and L are the respective characteristic impedances and the physical lengths of transmission line sections 54A and 54B, $C_{56A}$ is the capacitance of capacitor 56A, $C_{56B}$ is the capacitance of capacitor 56B, ω is the angular frequency of a signal in the centre of the operating band of the half-wave balun, and λ is the wavelength of that signal.

The capacitance of capacitor 57 is given by EQUATION 2 below.

$$C_{56A} = C_{56B} = \frac{C_{57}}{2} \qquad \text{EQUATION 2}$$

where $C_{57}$ is the capacitance of capacitor 57.

It is apparent that a DC bias can be applied to both signal carrying terminals T2 and T3 of the half-wave balun 50 of FIG. 5 by the application of a DC bias to any one of first circuit node 53A, second circuit node 53B or third circuit node 53C.

It is also apparent that a DC bias which is present on signal carrying terminal T1 will be present on signal carrying terminals T2 and T3.

Figure 6A:
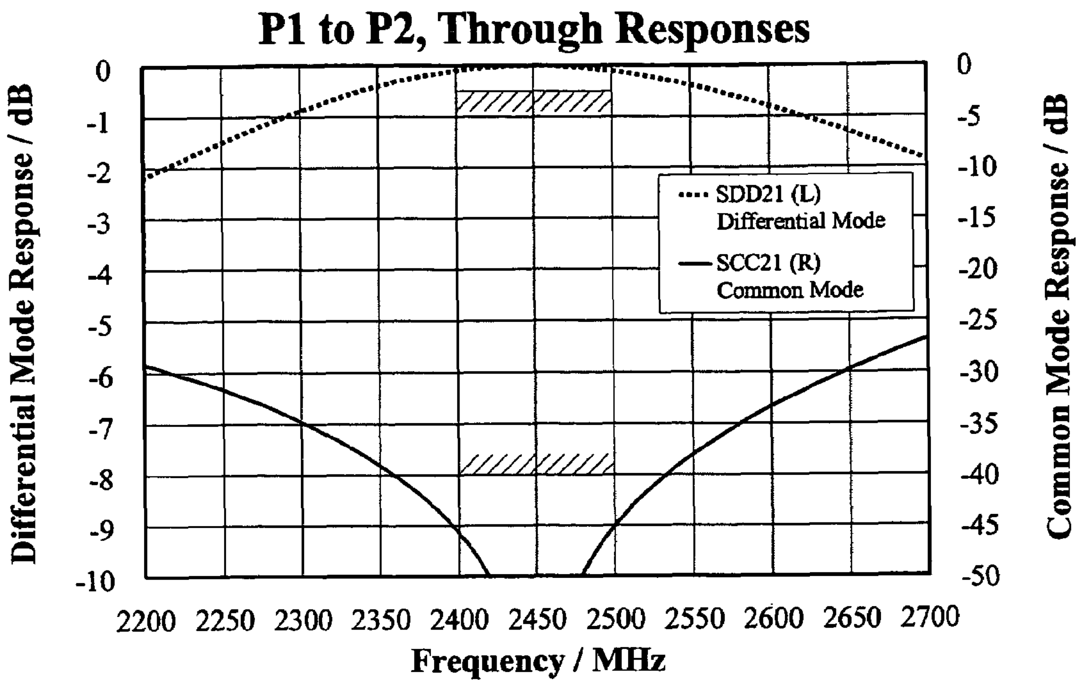
FIG. 6A shows an exemplary differential mode response $S_{DS21}$ and common mode response $S_{CS21}$ of the circuit of FIG. 5.

FIG. 6A shows a plot of the differential mode response ($S_{DS21}$) and the common mode response ($S_{CS21}$) of the half-wave balun of FIG. 5 under the following conditions:

$$C_{56A} = C_{56B} = \frac{C_{57}}{2} = 4.85 \text{ pF};$$

the characteristic impedances of transmission line sections 54A and 54B are both 50Ω and the electrical lengths E are both 15° at an operating frequency of 2.45 GHz; the differential mode component $Z_{DL}$ of the load impedance at I/O port P2 is related to the source impedance $Z_S$ as follows $Z_{DL}=4\times Z_S$.

Figure 1:
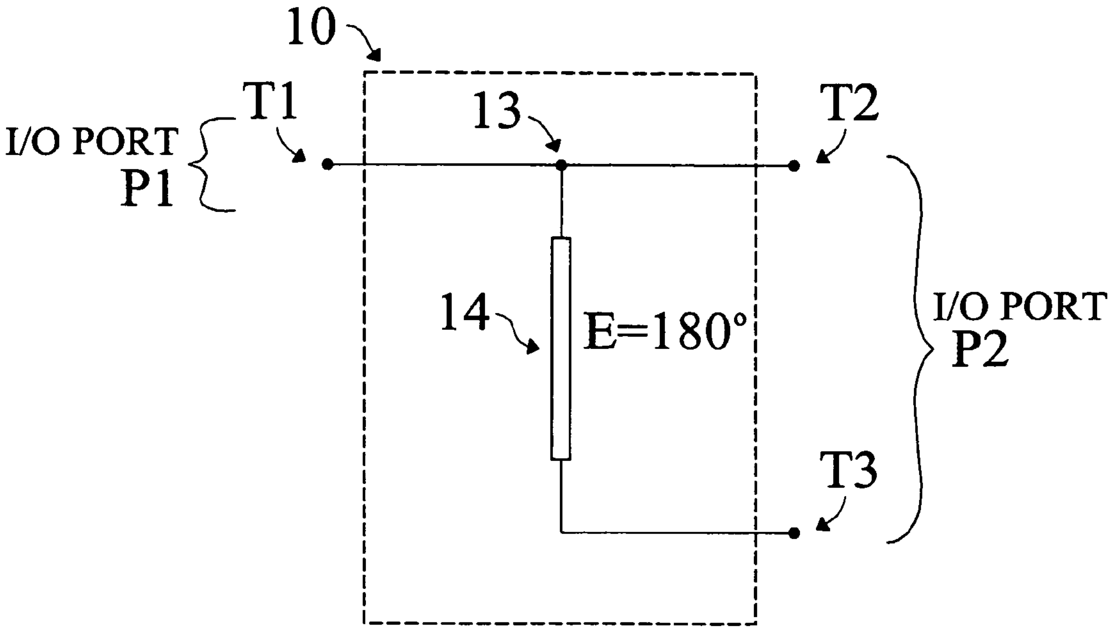
FIG. 1 (Prior Art)
FIG. 1 shows a conventional half-wave balun.
Figure 2:
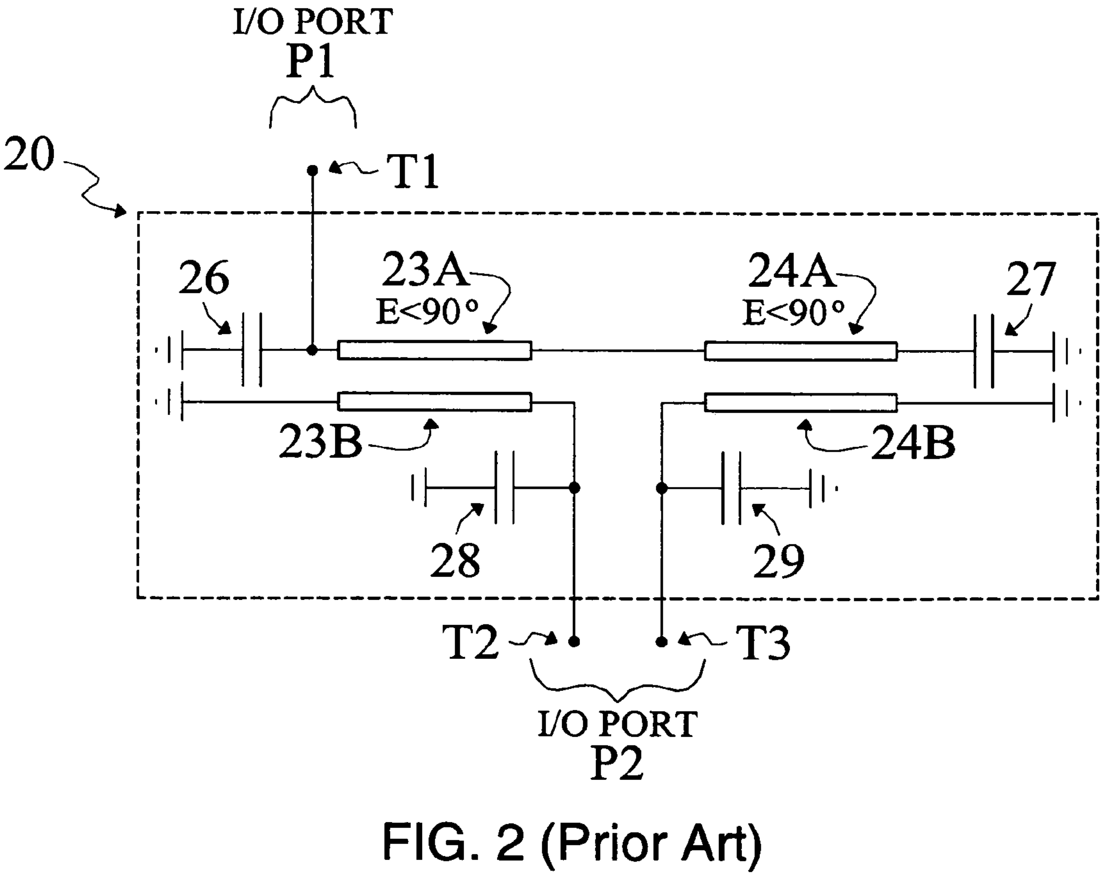
FIG. 2 (Prior Art)
FIG. 2 shows a conventional miniaturised Marchand balun.
Figure 3:
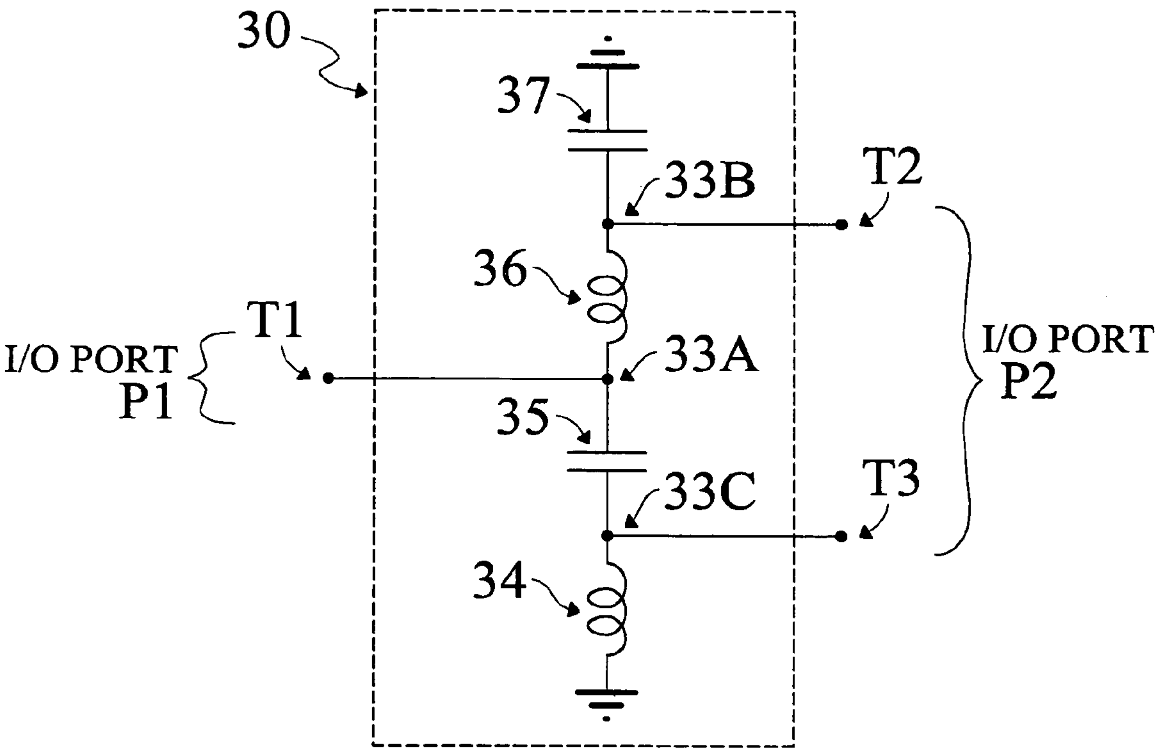
FIG. 3 (Prior Art)
FIG. 3 shows a conventional LC balun.
Figure 4A:
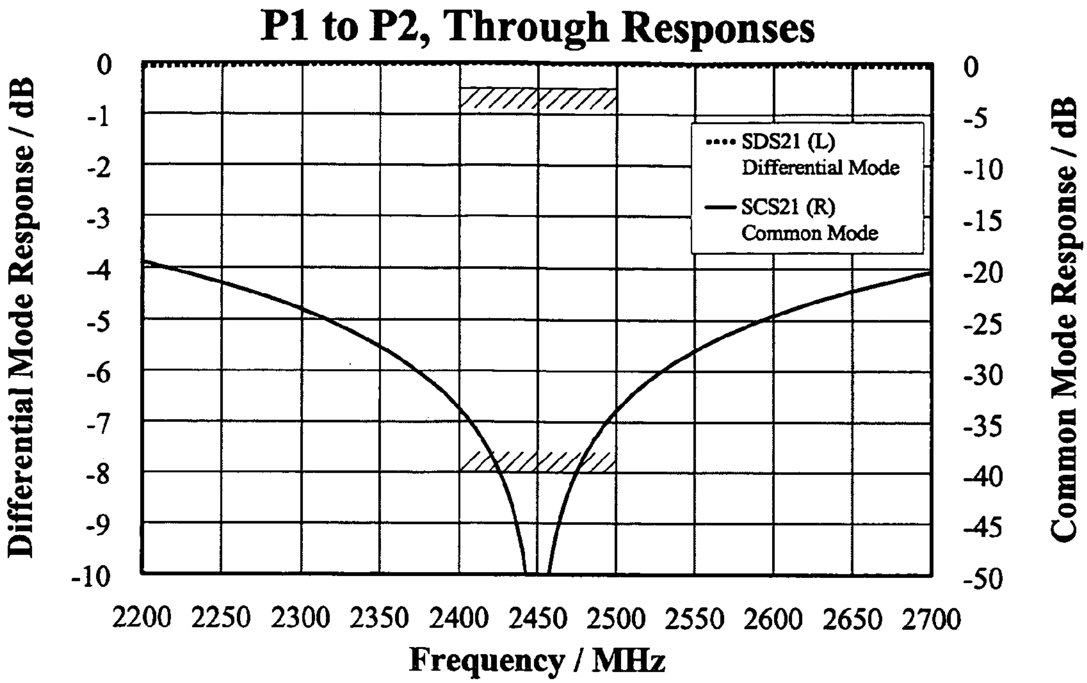
FIG. 4A (Prior Art)
FIG. 4A shows through responses of the LC balun of FIG. 3 around a passband of 2.45 GHz.

It can be seen from the plot of FIG. 6A that the differential mode insertion loss from 2.4 GHz to 2.5 GHz is less than 0.5 dB, and the common mode response of the circuit from 2.4 GHz to 2.5 GHz is less than −40 dB which is a significant improvement compared with the common mode response of the LC balun of FIG. 3 shown in FIG. 4A.

Figure 6B:
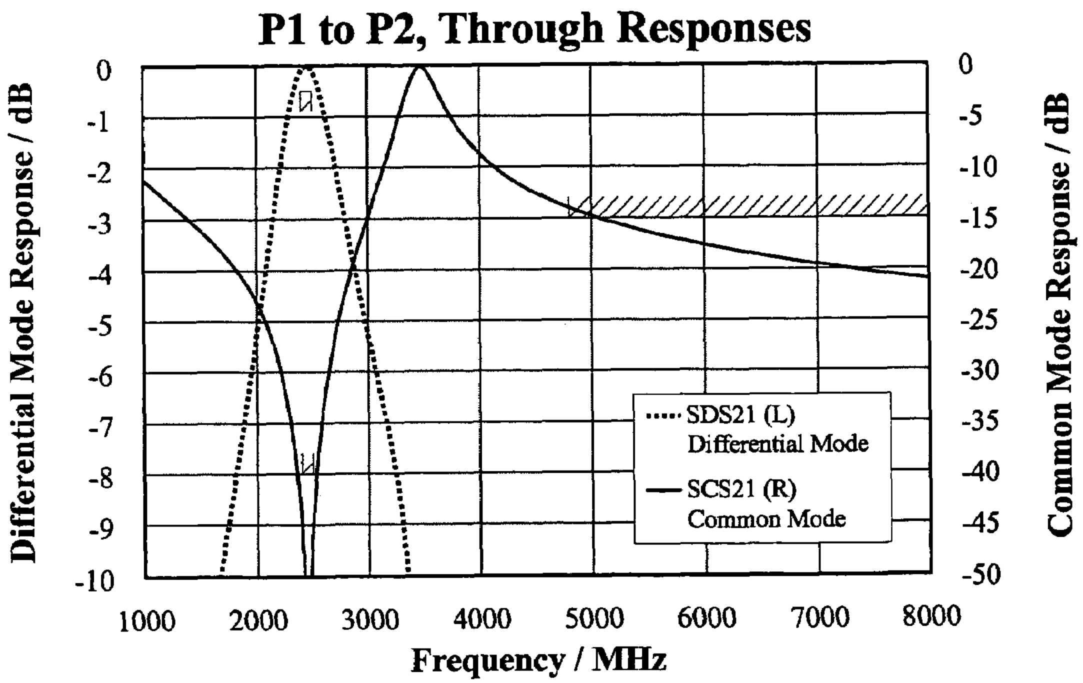
FIG. 6B shows a wide-band differential mode response $S_{DS21}$ and a wide-band common mode response $S_{CS21}$ of the circuit of FIG. 5 under same conditions as FIG. 6A.

FIG. 6B shows a plot of the wide-band differential mode response ($S_{DS21}$) and the wide-band common mode response ($S_{CS21}$) of the half-wave balun 50 of FIG. 5 under the same conditions as FIG. 6A.

Figure 4B:
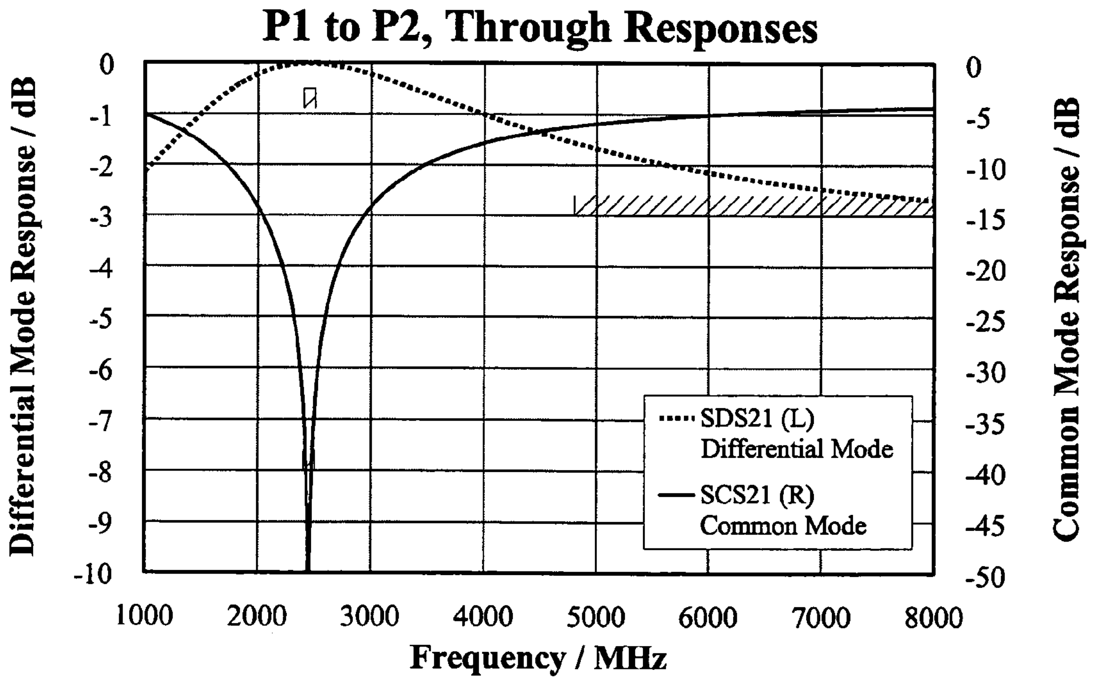
FIG. 4B (Prior Art)
FIG. 4B shows through responses of the LC Balun of FIG. 3 over a wide frequency range.

It can be seen that the common mode response of the half-wave balun 50 of FIG. 5 decreases monotonically with increasing frequency above 3.5 GHz so that the common mode response falls below −15 dB at frequencies of 5 GHz approximately and higher. Similarly, the common mode response of the half-wave balun 50 of FIG. 5 is less than −100 dB at frequencies below the passband starting from 1 GHz approximately. It will be seen that relative to FIG. 4B, the common mode response of the circuit of FIG. 5 is improved at the higher order harmonic frequencies. Such a circuit is useful where the circuit of FIG. 3 provides an unacceptably high common mode output signal at a harmonic of the operating frequency.

Figure 6C:
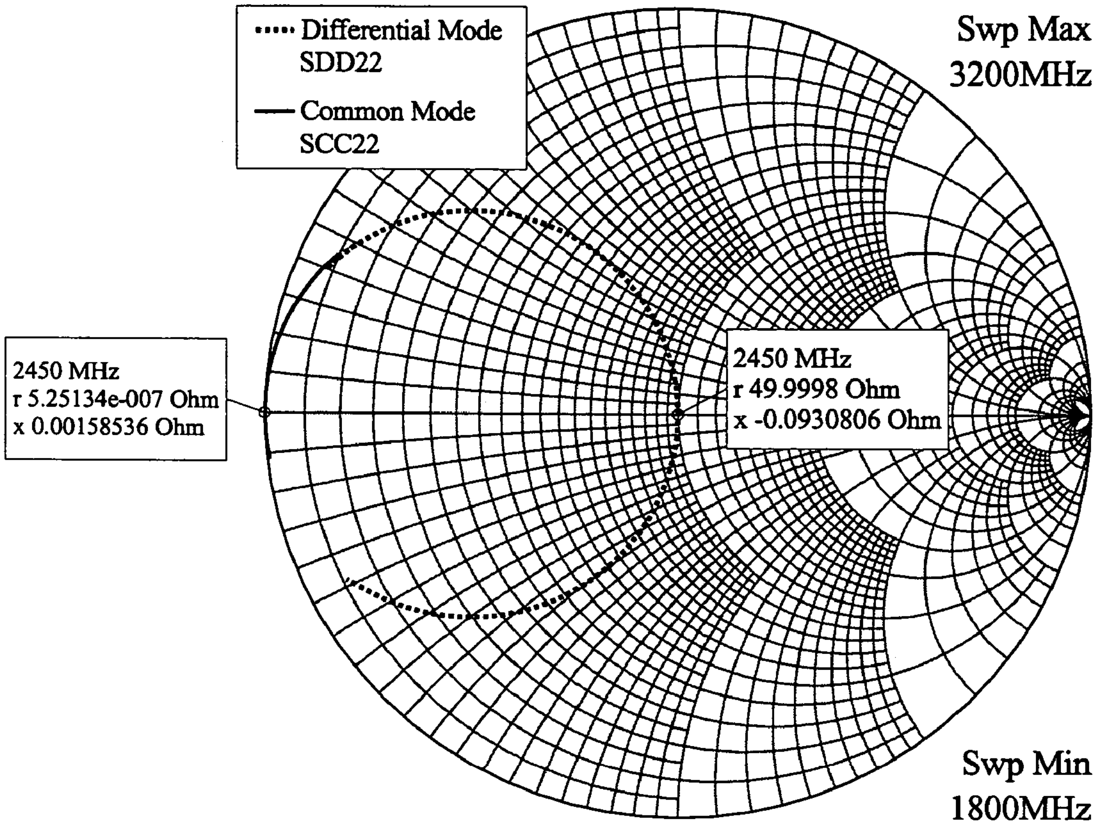
FIG. 6C shows a Smith chart plot of the differential mode reflection coefficient $S_{DD22}$ at I/O port P2 and the common mode reflection coefficient $S_{CC22}$ at I/O port P2 of circuit of FIG. 5 under same conditions as FIG. 6A.

FIG. 6C shows a Smith chart plot of the differential mode reflection coefficient ($S_{DD22}$) and the common mode reflection co-efficient ($S_{CC22}$) at I/O port P2 of the half-wave balun 50 of FIG. 5 under the same conditions as FIG. 6A. It can be seen from FIG. 6C that the resulting common mode impedance of the half-wave balun 50 at I/O port P2 is approximately zero Ω at 2.45 GHz. It is also apparent from FIG. 6C that the differential mode impedance of the half-wave balun 50 at I/O port P2 is matched to the differential mode component of the load impedance. The very low common mode impedance of the half-wave balun 50 at I/O port P2 at 2.45 GHz is what gives rise to the very low common mode response of the circuit at the same frequency as shown in FIG. 6A and FIG. 6B.

Figure 7:
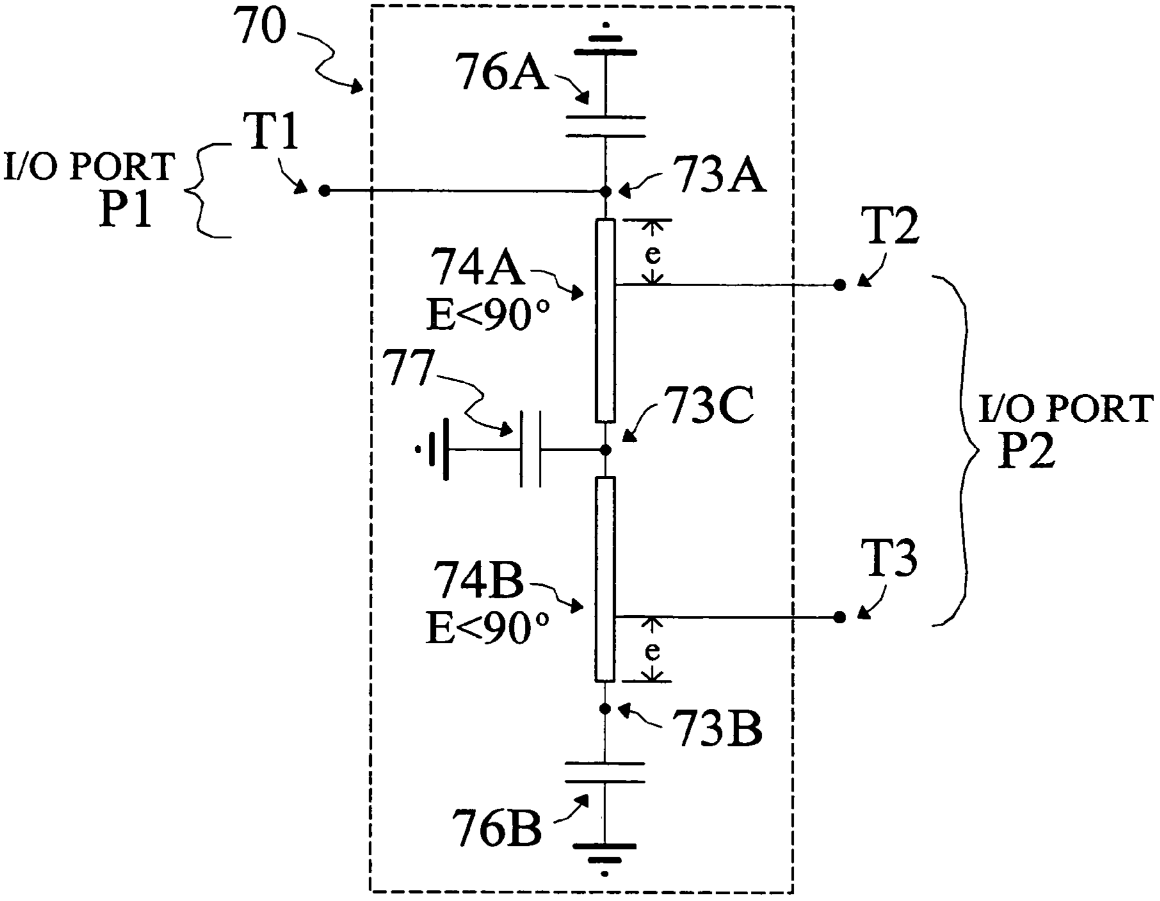
FIG. 7 shows a miniaturised half-wave balun according to a second embodiment of the present invention.

FIG. 7 shows a miniaturised half-wave balun 70 according to a second embodiment of the present invention. The half-wave balun 70 having a given operating band defined by a lower frequency limit $F_L$ and an upper frequency limit $F_U$.

The half-wave balun 70 comprises a pair of transmission line sections 74A and 74B which have substantially identical physical properties and where each of transmission line sections 74A and 74B has an electrical length E which is substantially less than 90° at the centre of the operating band of the half-wave balun 70. A first end of transmission line section 74A is connected to a shunt capacitor 76A at a first circuit node 73A, a first end of transmission line section 74B is connected to a shunt capacitor 76B at a circuit point 73B, second ends of transmission line sections 74A and 74B are connected together at a second circuit node 73C, and a shunt capacitor 77 is also connected to second circuit node 73C.

The miniaturised half-wave balun 70 of FIG. 7 further comprises a single-ended I/O port P1 comprising a signal carrying terminal T1 connected to first circuit node 73A, and differential I/O port P2 comprising a pair of signal carrying terminals T2 and T3 where signal carrying terminal T2 is connected at a point along the first transmission line section 74A between first circuit node 73A and second circuit node 73C at a distance e from first circuit node 73A, and where signal carrying terminal T3 is connected at a point along the second transmission line section 74B between circuit point 73B and second circuit node 73C at a distance e from circuit point 73B.

By connecting signal carrying terminal T2 at a point along transmission line 74A at a distance e from first circuit node 73A and signal carrying terminal T3 at a point along transmission line 74B at a distance e from circuit point 73B, the half-wave balun 70 can be matched to a particular load impedance connected to I/O port P2. EQUATION 3 gives the relationship between the source impedance $Z_S$ connected at I/O port P1 and the differential mode component of the load impedance $Z_{DL}$ connected at I/O port P2 in terms of the physical lengths L of coupled line sections 74A and 74B and the distance e.

$$Z_{DL} = \left[\frac{2(L-e)}{L}\right]^2 Z_S \qquad \text{EQUATION 3}$$

Figure 8A:
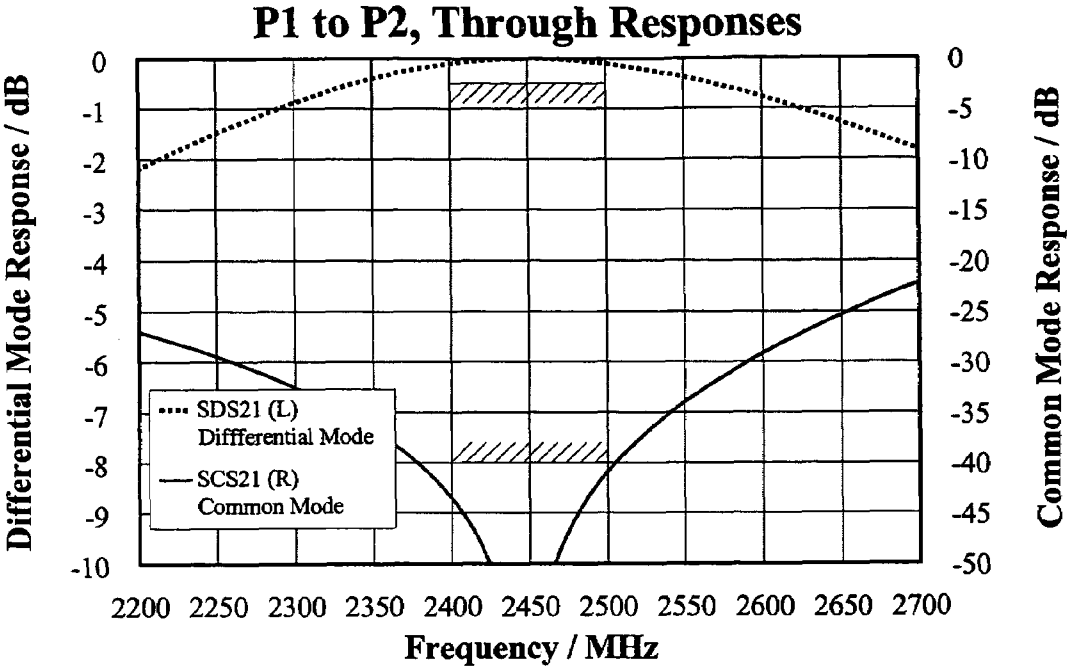
FIG. 8A shows an exemplary differential mode response $S_{DS21}$ and common mode response $S_{CS21}$ of the circuit of FIG. 7.

FIG. 8A shows a plot of the differential mode response ($S_{DS21}$) and the common mode response ($S_{CS21}$) of the half-wave balun of FIG. 7 under the following conditions: $C_{76A}=C_{76B}=4.92$; $C_{77}=14$ pF; the characteristic impedances of transmission line sections 54A and 54B are both 50Ω and the electrical lengths E are both 15° at an operating frequency of 2.45 GHz; signal carrying terminal T2 is connected at a point along transmission line 74A which is at a distance e of 4.4° from first circuit node 73A (where the distance e is given in units of the phase of an RF signal with a frequency of 2.45 GHz) and signal carrying terminal T3 is connected at a point along transmission line 74B the same distance from circuit point 73B; the differential mode component of the load impedance $Z_{DL}$ at I/O port P2 is 100Ω and the source impedance $Z_S$ connected at I/O port P1 is 50Ω.

Under the above stated conditions, the differential mode insertion loss of the of the half-wave balun of FIG. 7 from 2.4 GHz to 2.5 GHz is less than 0.5 dB, and the common mode response of the circuit from 2.4 GHz to 2.5 GHz is less than −40 dB.

Figure 8B:
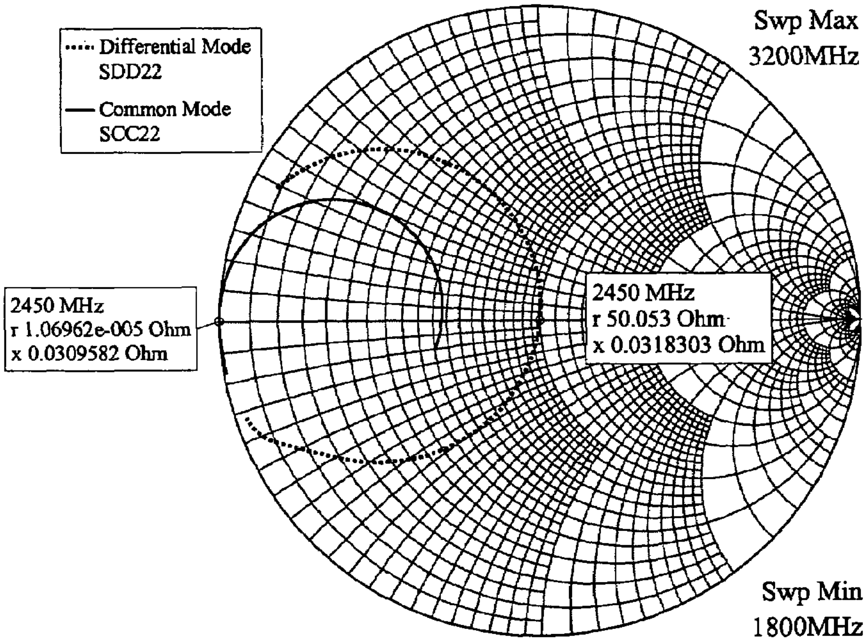
FIG. 8B shows a Smith chart plot of the differential mode reflection coefficient $S_{DD22}$ at I/O port P2 and the common mode reflection coefficient $S_{CC22}$ at I/O port P2 for the circuit of FIG. 7 under same conditions as FIG. 8A.
Figure 9A:
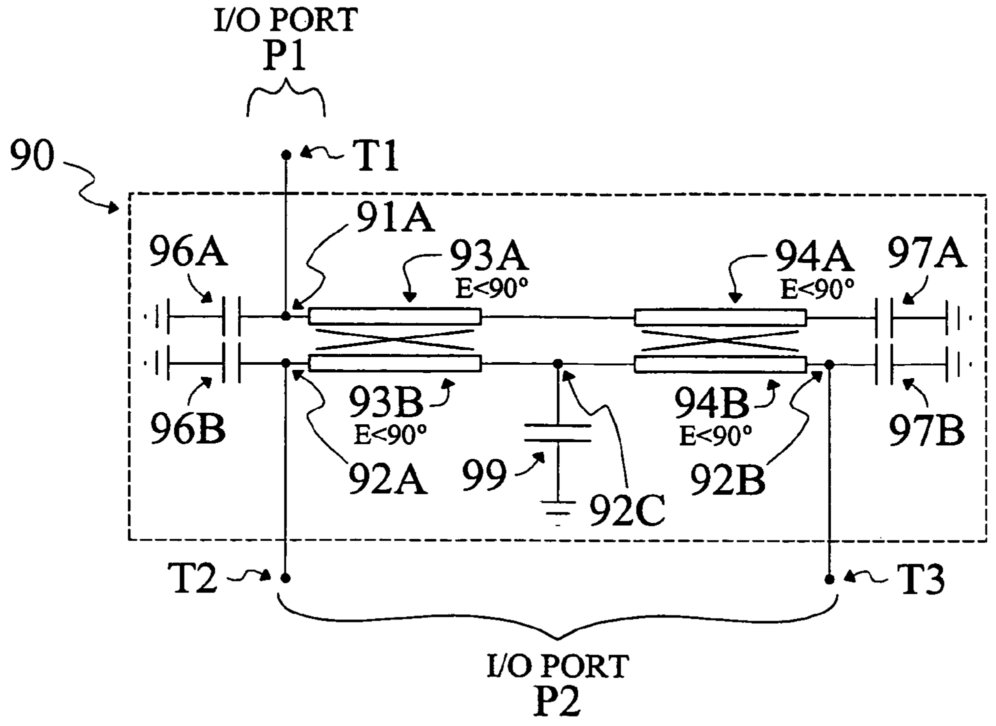
FIG. 9A shows a miniaturised coupled-line half-wave balun according to a third embodiment of the present invention.

FIG. 8B shows a Smith chart plot of the differential mode reflection coefficient ($S_{DD22}$) and the common mode reflection co-efficient ($S_{CC22}$) at I/O port P2 of the half-wave balun 70 of FIG. 7 under the same conditions as FIG. 8A. It can be seen from FIG. 8B that the resulting common mode impedance of the half-wave balun 80 at I/O port P2 is approximately zero Ω at 2.45 GHz. It is also apparent from FIG. 8B that the differential mode impedance of the half-wave balun 70 at I/O port P2 is matched to the differential mode component $Z_{DL}$ of the load impedance. The very low common mode impedance of the half-wave balun 70 at I/O port P2 at 2.45 GHz is what gives rise to the very low common mode response of the circuit at the same frequency as shown in FIG. 8A FIG. 9A shows a miniaturised coupled-line half-wave balun 90 according to a third embodiment of the present invention. The coupled-line half-wave balun 90 having a given operating band defined by a lower frequency limit $F_L$ and an upper frequency limit $F_U$.

The coupled-line half-wave balun 90 of FIG. 9A comprises a first pair of coupled transmission line sections comprising coupled transmission line sections 93A and 93B and a second pair of coupled transmission line sections comprising coupled transmission line sections 94A and 94B, where the first pair of coupled transmission line sections 93A and 93B has substantially the same physical properties as the second pair of coupled transmission line sections 94A and 94B, and where the electrical length E of each of coupled transmission line sections 93A, 93B and 94A, 94B is substantially less than 90° at the centre of the operating band of the coupled-line half-wave balun 90.

A first end of coupled transmission line section 93A is connected to a shunt capacitor 96A at a first circuit node 91A, and a first end of coupled transmission line section 94A is connected to a shunt capacitor 97A, and second ends of coupled transmission line sections 93A and 94A are connected together.

A first end of coupled transmission line section 93B is connected to a shunt capacitor 96B at a second circuit node 92A, a first end of coupled transmission line section 94B is connected to a shunt capacitor 97B at a third circuit node 92B, and second ends of coupled transmission line sections 93B and 94B are connected together at a fourth circuit node 92C; a shunt capacitor 99 is also connected to fourth circuit node 92C.

The coupled-line half-wave balun 90 of FIG. 9A further comprises a single-ended I/O port P1 comprising a signal carrying terminal T1 connected to first circuit node 91A, and differential I/O port P2 comprising a pair of signal carrying terminals T2 and T3 connected to second circuit node 92A and third circuit node 92B respectively.

The capacitances of capacitors 96A, 96B, 97A, 97B are chosen to allow the use of coupled transmission line sections 93A, 93B, 94A and 94B each of which has an electrical length E which is less than 90° at the centre of the operating band of the coupled-line half-wave balun 90.

The capacitance of capacitor 99 is chosen to minimize the common mode impedance at differential I/O port P2 and at the centre of the operating band of the coupled-line half-wave balun 90.

It is apparent that a DC bias can be applied to both signal carrying terminals T2 and T3 of the coupled-line half-wave balun 90 of FIG. 9A, by the application of a DC bias to any one of second circuit node 92A, third circuit node 92B or fourth circuit node 92C.

Figure 9B:
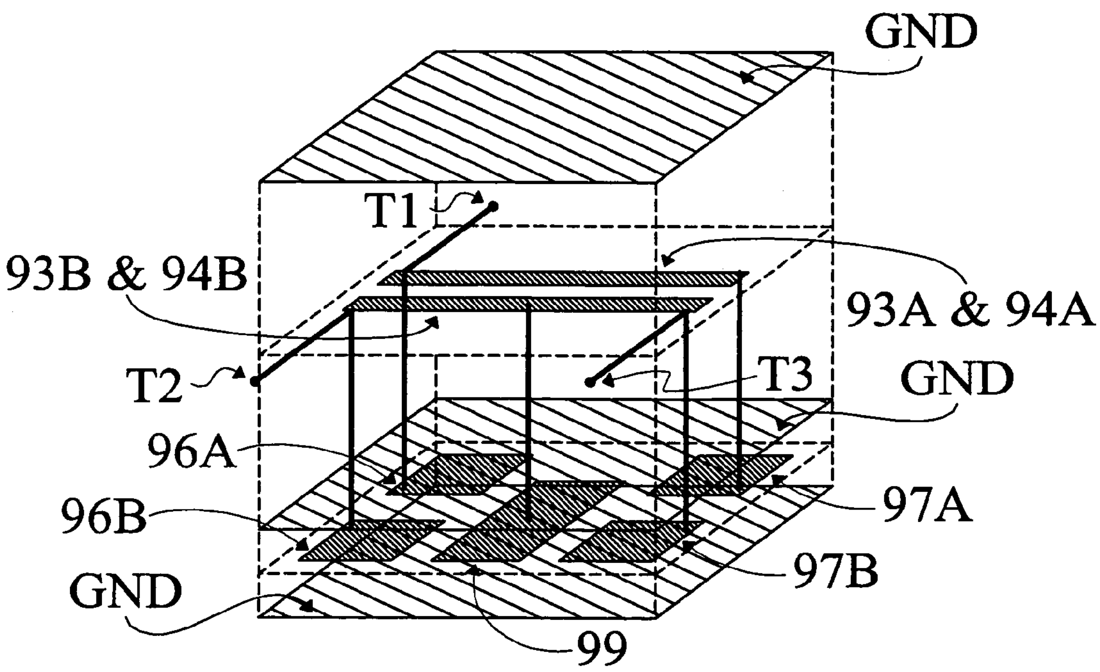
FIG. 9B is a perspective drawing of the miniaturised coupled-line half-wave balun of FIG. 9A.

FIG. 9B shows a 3D drawing of the coupled-line half-wave balun 90 of FIG. 9A, wherein coupled transmission line sections 93A and 93B and coupled transmission line sections 94A and 94B are chosen to be edge coupled transmission lines, and wherein transmission line sections 93A, 93B, 94A and 94B are fabricated in a multilayer substrate (note that the miniaturised coupled-line half-wave balun 90 of FIG. 9A could be realized using edge coupled transmission lines or broadside coupled lines).

Figure 10A:
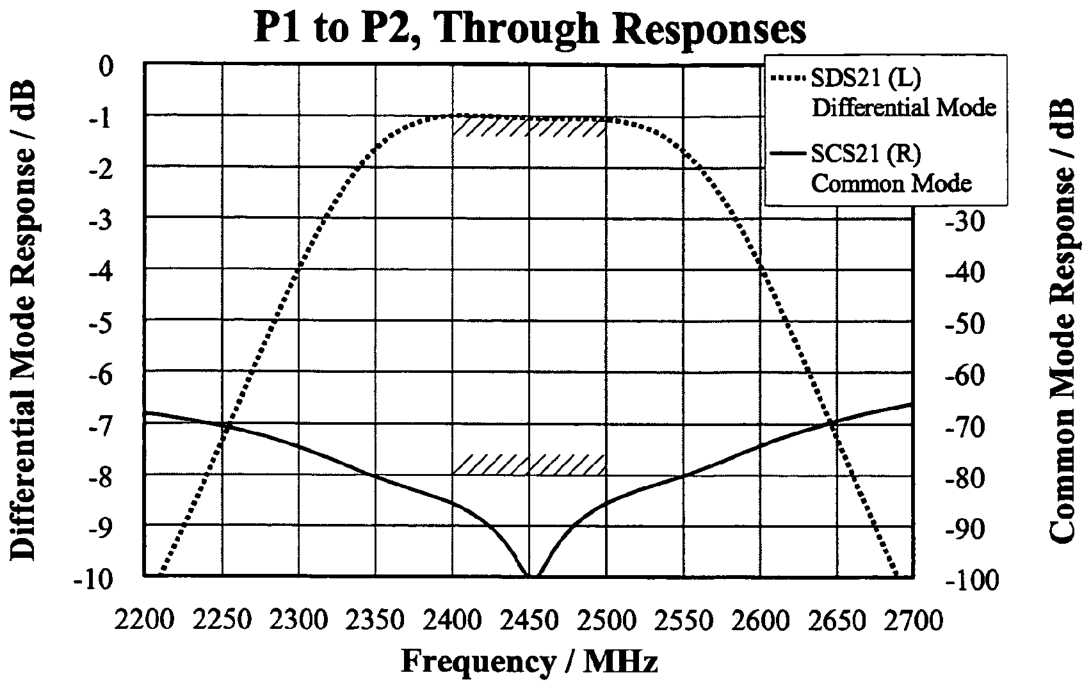
FIG. 10A shows an exemplary differential mode response $S_{DS21}$ and common mode response $S_{CS21}$ of the coupled-line half-wave balun 90 of FIG. 9A.

FIG. 10A shows the through responses from I/O port P1 to I/O port P2 of the coupled-line half-wave balun 90 of FIG. 9A resulting from a quasi-electromagnetic simulation, wherein coupled transmission line sections 93A, 93B, 94A and 94B are fabricated in a multilayer substrate as depicted in FIG. 9B and where the physical properties of the coupled-line half-wave balun 90 are given in TABLE 1. It can be seen from FIG. 10A that the common mode response of the coupled-line half-wave balun 90 of FIG. 9A and FIG. 9B is extremely low (−85 dB approx) within the operating band of the coupled-line half-wave balun 90 of FIG. 9A.

TABLE 1

Physical properties of miniaturised coupled-line half-wave balun for 2.45 GHz operation according to a third embodiment of the present invention.

| Property | Value | Unit |
|---|---|---|
| Source impedance $Z_S$. | 50 | Ω |
| Differential mode component of load impedance $Z_{DL}$. | 200 | Ω |
| Lengths of coupled transmission line sections 93A, 93B, 94A and 94B. | 1000 | μm |
| Widths of coupled transmission line sections 93A, 93B, 94A and 94B. | 100 | μm |
| Gaps between coupled transmission line sections 93A and 93B and between 94A and 94B. | 330 | μm |
| Relative dielectric constant of substrate material. | 75 | — |
| Thickness of dielectric layer above coupled transmission line sections 93A, 93B, 94A and 94B. | 300 | μm |
| Thickness of dielectric layer below coupled transmission line sections 93A, 93B, 94A and 94B. | 300 | μm |
| Capacitances of capacitors 96A, 96B, 97A and 97B. | 8.35 | pF |
| Capacitance of capacitor 99 | 16.7 | pF |

Figure 10B:
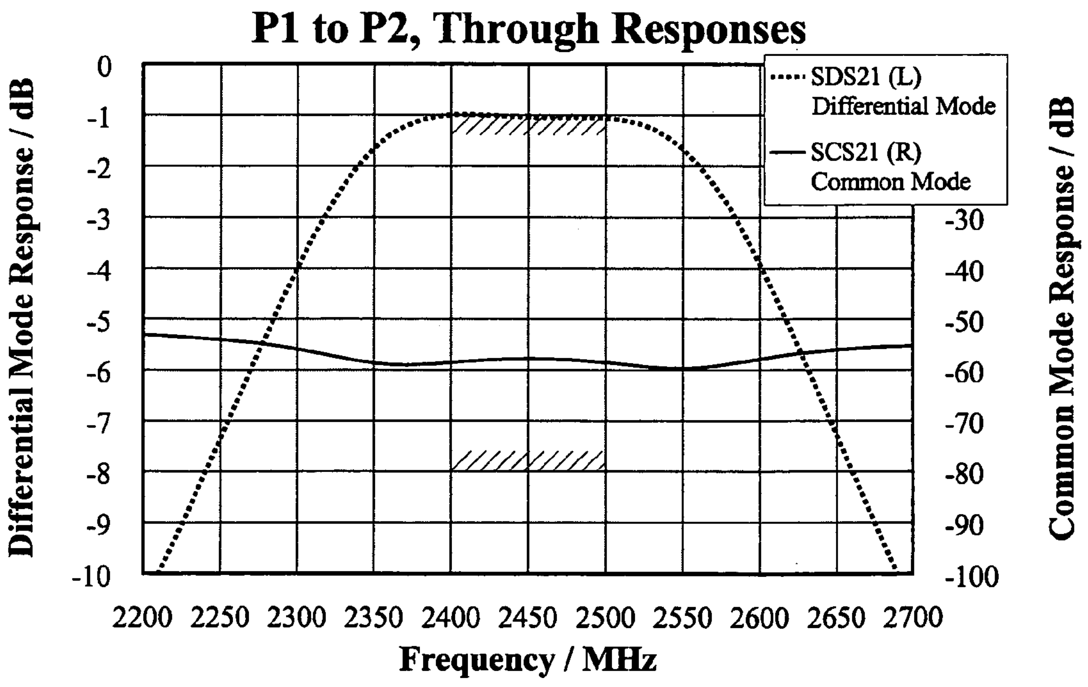
FIG. 10B shows an exemplary differential mode response $S_{DS21}$ and common mode response $S_{CS21}$ of a the circuit of FIG. 9A under same conditions as FIG. 10A with the exception that shunt capacitor 99 of FIG. 9A has been omitted.

FIG. 10B shows the through responses from I/O port P1 to I/O port P2 of the coupled-line half-wave balun 90 of FIG. 9A resulting from a quasi-electromagnetic simulation wherein capacitor 99 has been removed from the circuit (or where the capacitance of capacitor 99 has been reduced to zero pF). It can be seen that the common mode response of the coupled-line half-wave balun 90 of FIG. 9A and FIG. 9B has been substantially degraded by the omission of capacitor 99.

Figure 11:
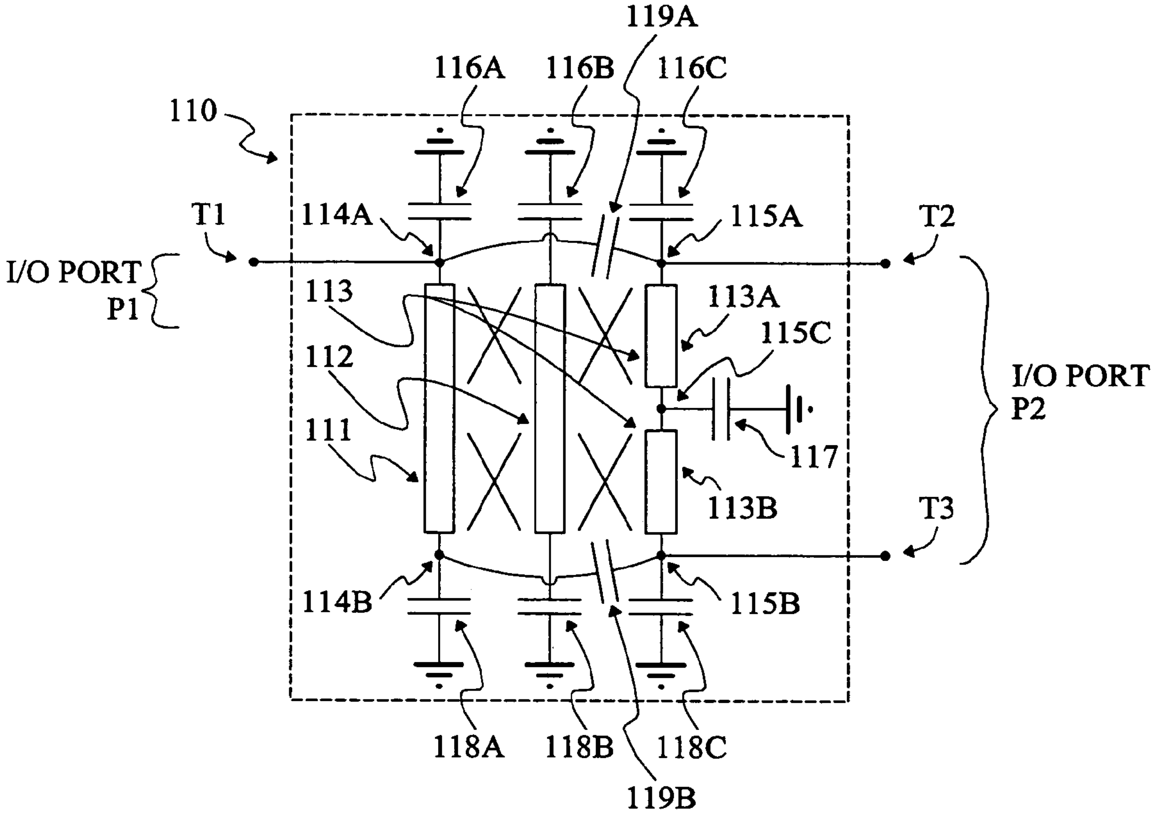
FIG. 11 shows a miniaturised coupled-line bandpass filter according to a fourth embodiment of the present invention.

FIG. 11 shows a miniaturised coupled-line bandpass filter 110 according to a fourth embodiment of the present invention. The coupled-line bandpass filter 110 has a given passband defined by a lower frequency limit $F_L$ and an upper frequency limit $F_U$. Coupled-line bandpass filter 110 comprises a single-ended I/O port P1 and a differential I/O port P2, where I/O port P1 comprises signal carrying terminal T1 and where I/O port P2 comprises a pair of signal carrying terminals T2 and T3. Coupled-line bandpass filter 110 further comprises three coupled transmission lines 111, 112 and 113, where coupled transmission line 113 is divided into two sections, 113A and 113B. A first end of coupled transmission line 111 is connected to shunt capacitor 116A and to signal carrying terminal T1 at a first circuit node 114A. A second end of coupled transmission line 111 is connected to shunt capacitor 118A at a second circuit node 114B. A first end of coupled transmission line 112 is connected to shunt capacitor 116B and a second end of coupled transmission line 112 is connected to shunt capacitor 118B. A first end of coupled transmission line section 113A is connected to shunt capacitor 116C and to signal carrying terminal T2 at a third circuit node 115A. A first end of coupled transmission line section 113B is connected to shunt capacitor 118C and to signal carrying terminal T3 at a fourth circuit node 115B. A second end of coupled transmission line section 113A and a second end of coupled transmission line section 113B are connected together at a fifth circuit node 115C; shunt capacitor 117 is also connected to fifth circuit node 117.

The section of RF filter 110 comprising capacitors 116C and 118C, and coupled transmission line sections 113A and 113B is symmetric about fifth circuit node 115C, so that the capacitances of capacitors 116C and 118C are substantially equal, and so that the electrical lengths and characteristic impedances of coupled transmission line sections 113A and 113B are substantially equal.

The RF filter 110 of FIG. 11 has an operating band defined by a lower frequency limit $F_L$ and an upper frequency limit $F_U$. Coupled transmission lines 111, 112 and 113 each have an electrical length which is substantially less than 180° (one half wavelength) at the centre of the operating band of the RF filter 110. Shunt capacitors 116A, 116B, 116C, 118A, 118B, and 118C have the effect of loading coupled transmission lines 111, 112 and 113, so that the combination of coupled transmission line 111 and shunt capacitors 116A and 118A is electrically equivalent to a coupled transmission line with an electrical length of 180°, so that the combination of coupled transmission line 112 and shunt capacitors 116B and 118B is electrically equivalent to a coupled transmission line with an electrical length of 180° and so that the combination of coupled transmission line 113 and shunt capacitors 116C and 118C is electrically equivalent to a coupled transmission line with an electrical length of 180°.

The capacitance of shunt capacitor 117 is selected so that the common mode impedance of the coupled-line bandpass filter 110 measured at I/O port P2 is substantially zero Ω at the centre of the operating band of coupled-line bandpass filter 110. Thus, the capacitances of capacitors 116C, 118C and 117 are related by the EQUATION 4.

$$C_{116C} = C_{118C} = \frac{C_{117}}{2} \qquad \text{EQUATION 4}$$

where $C_{116C}$, $C_{118C}$ and $C_{117}$ are the capacitances of capacitors 116C, 118C and 117 respectively.

Feedback capacitors 119A and 119B are connected between first and third circuit nodes 114A and 115A and between second and fourth circuit nodes 114B and 115B respectively. The capacitances of feedback capacitors 119A and 119B are selected to introduce a resonance pole in the differential mode response of the coupled-line bandpass filter 110 at a frequency below the passband.

It is apparent that a DC bias can be applied to both signal carrying terminals T2 and T3 of the coupled-line bandpass filter 110 of FIG. 11, by the application of a DC bias to any one of third circuit node 115A, fourth circuit node 115B or fifth circuit node 115C.

Figure 12A:
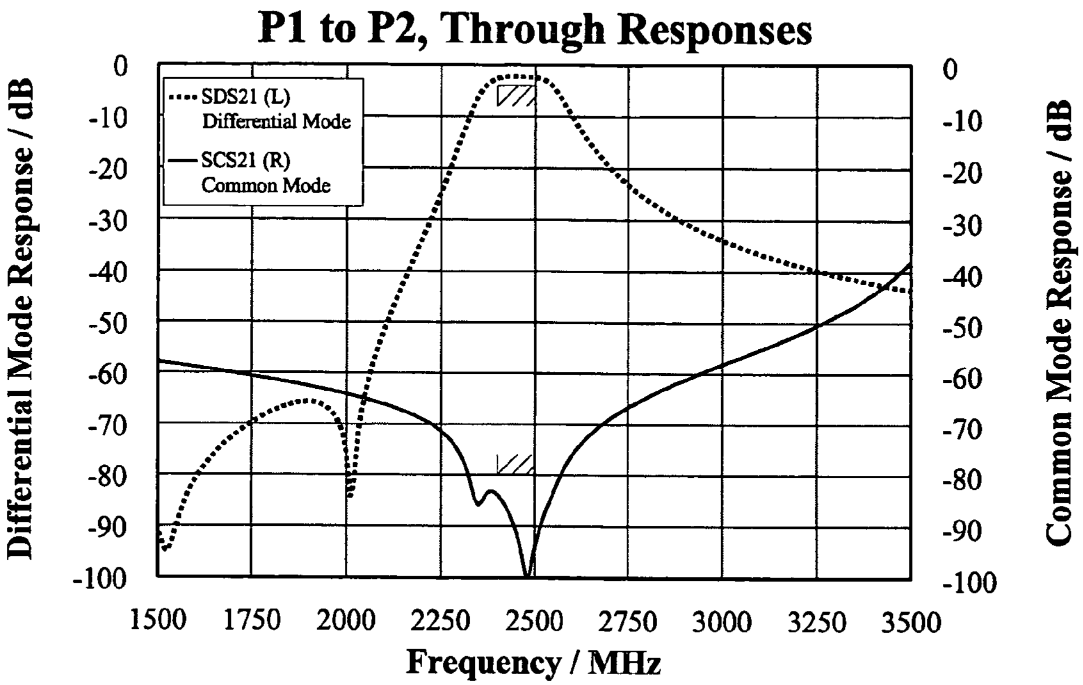
FIG. 12A shows an exemplary differential mode response $S_{DS21}$ and common mode response $S_{CS21}$ of the coupled-line bandpass filter 110 of FIG. 11.

FIG. 12A shows the through responses from I/O port P1 to I/O port P2 of the miniaturised coupled-line bandpass filter 110 of FIG. 11 resulting from a quasi-electromagnetic simulation, wherein coupled transmission lines 111, 112, and 113 are edge coupled and fabricated in a multilayer substrate and where the physical properties of the coupled-line bandpass filter 110 are given in TABLE 2. It can be seen from FIG. 12A that the common mode response of the coupled-line bandpass filter 110 of FIG. 11 is extremely low (−80 dB approx) within the passband of the coupled-line bandpass filter 110 of FIG. 11.

TABLE 2

Physical properties of miniaturised coupled-line bandpass filter for 2.45 GHz operation according to a fourth embodiment of the present invention.

| Property | Value | Unit |
|---|---|---|
| Source impedance $Z_S$. | 50 | Ω |
| Differential mode component of load impedance $Z_{DL}$. | 200 | Ω |
| Lengths of coupled transmission lines 111, 112 and 113. | 1000 | μm |
| Widths of coupled transmission lines 111, 112 and 113. | 170 | μm |
| Gaps between coupled transmission lines 111 and 112 and between 112 and 113 | 350 | μm |
| Relative dielectric constant of substrate material. | 75 | — |
| Thickness of dielectric layer above coupled transmission lines 111, | 285 | μm |
| Thickness of dielectric layer below coupled transmission lines 111, | 285 | μm |
| Capacitances of capacitors 116A, 116B, 118A, and 118B. | 8.5 | pF |
| Capacitances of capacitors 116C and 118C. | 8.1 | pF |
| Capacitances of capacitor 119A and 119B. | 16.2 | pF |
| Capacitances of capacitor 117 | 0.16 | pF |

Figure 12B:
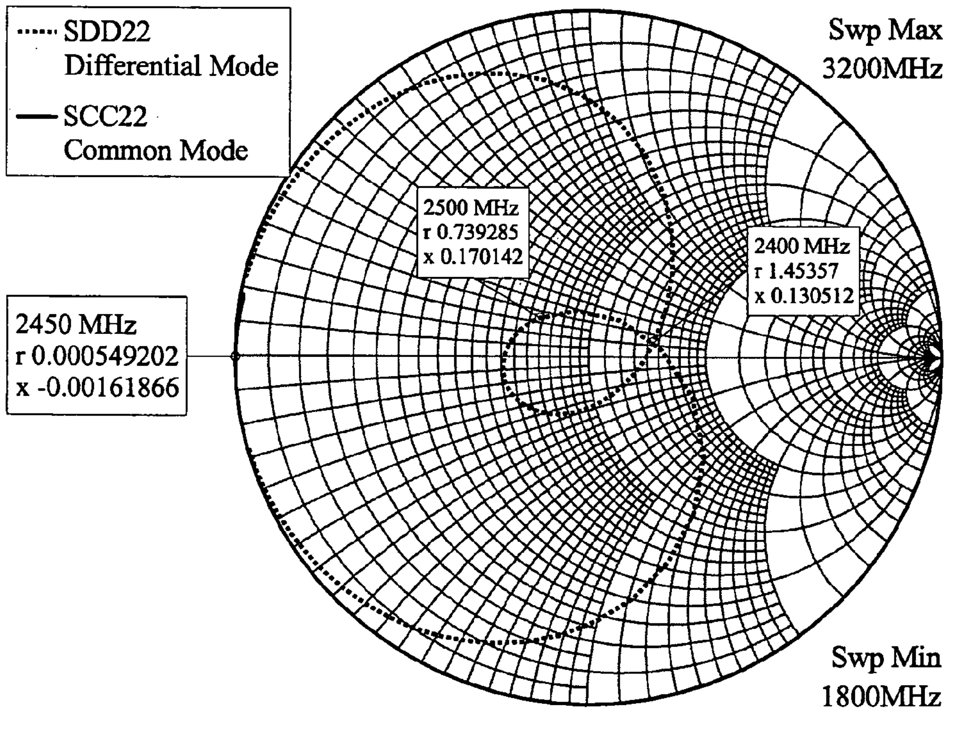
FIG. 12B shows an exemplary differential mode reflection coefficient $S_{DD22}$ and common mode reflection coefficient $S_{CC22}$ at I/O port P2 of coupled-line bandpass filter 110 of FIG. 11.

FIG. 12B shows the differential mode reflection coefficient $S_{DD22}$ and the common mode reflection coefficient $S_{CC22}$ at I/O port P2 of the miniaturised coupled-line bandpass filter 110 of FIG. 11 resulting from a quasi-electromagnetic simulation, under the same conditions as FIG. 12A. It can be seen that the common mode component of the impedance of the miniaturised coupled-line bandpass filter 110 of FIG. 11 at I/O port P2 is substantially zero Ω within the passband of the miniaturised coupled-line bandpass filter 110 of FIG. 11. The effect of the low common mode impedance is to significantly attenuate the common mode response of the filter.

Figure 13:
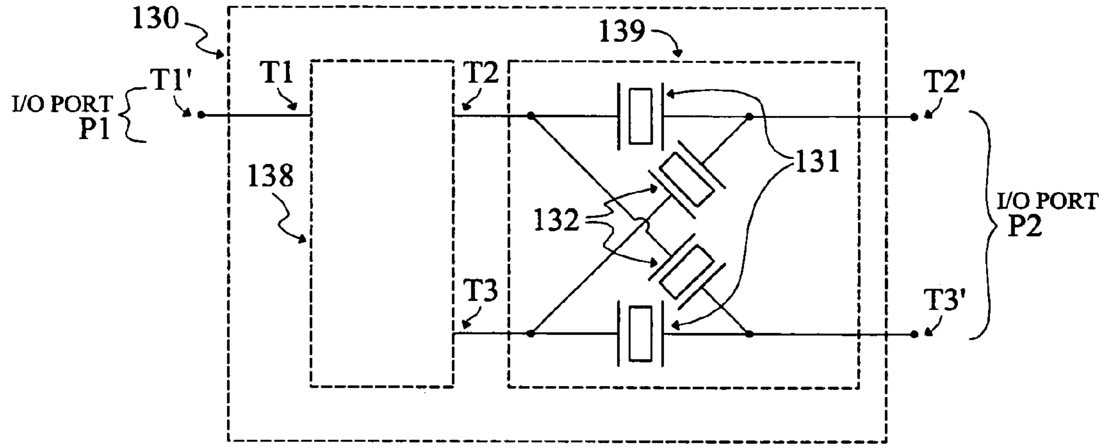
FIG. 13 shows a single-ended to differential bandpass filter comprising a lattice-type acoustic resonator filter and a miniaturised half-wave balun according to a fifth embodiment of the present invention.

FIG. 13 shows a single-ended to differential bandpass filter 130 comprising a lattice type acoustic resonator filter 139 according to a fifth embodiment of the present invention. The single ended to differential bandpass filter 130 comprises a single ended I/O port P1 comprising a signal carrying terminal T1' and differential I/O port P2 comprising a pair of signal carrying terminals T2' and T3'.

Lattice acoustic resonator network 139 comprises series acoustic resonators 131 and parallel acoustic resonators 132, where acoustic resonators 131 and 132 are of the surface acoustic wave (SAW) type or the bulk acoustic wave (BAW) type and where the properties of acoustic resonators 131 and 132 are chosen so that lattice acoustic resonator network 139 has a passband defined by a lower frequency limit $F_L$ and an upper frequency limit $F_U$.

The differential bandpass filter of FIG. 13 further comprises a miniaturised half-wave balun 138 according to the first, the second or the third embodiment of the present invention, where signal carrying terminal T2 of the miniaturised half-wave balun 138 is connected to a first input signal carrying terminal of lattice acoustic resonator network 139, and where signal carrying terminal T3 of the miniaturised half-wave balun 138 is connected to a second input signal carrying terminal of lattice acoustic resonator network 139 and where the miniaturised half-wave balun 138 has a given operating band which overlaps the passband of lattice acoustic resonator network 139.

Figure 14:
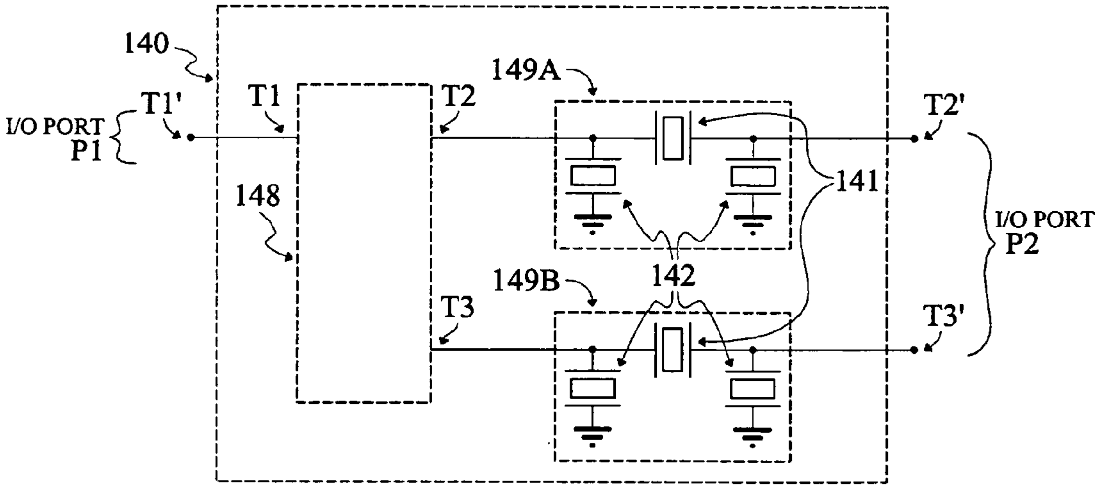
FIG. 14 shows a single-ended to differential bandpass filter comprising ladder-type acoustic resonator filters and a miniaturised half-wave balun according to a sixth embodiment of the present invention.

FIG. 14 shows a single-ended to differential bandpass filter 140 comprising a miniaturised half-wave balun 148 and a pair of ladder-type acoustic resonator filters 149A and 149B according to a sixth embodiment of the present invention. The single-ended to differential bandpass filter 140 comprises a single-ended I/O port P1 comprising a signal carrying terminal T1' and differential I/O port P2 comprising a pair of signal carrying terminals T2' and T3'.

Ladder-type acoustic resonator filters 149A and 149B comprise series acoustic resonators 141 and parallel acoustic resonators 142, where acoustic resonators 141 and 142 are of the surface acoustic wave (SAW) type or the bulk acoustic wave (BAW) type and where the properties of acoustic resonators 141 and 142 are chosen so that each of ladder-type acoustic resonator filter 149A and 149B has a passband defined by a lower frequency limit $F_L$ and an upper frequency limit $F_U$.

The differential bandpass filter of FIG. 14 further comprises a miniaturised half-wave balun 148 according to the first, the second or the third embodiment of the present invention, where signal carrying terminal T2 of the miniaturised half-wave balun 148 is connected to a an input signal carrying terminal of ladder-type acoustic resonator network 149A, and where signal carrying terminal T3 of the miniaturised half-wave balun 148 is connected to an input signal carrying terminal of ladder-type acoustic resonator network 149B and where the miniaturised half-wave balun 148 has an operating band which overlaps the passband of each of ladder-type acoustic resonator filter 149A and 149B.

It will be seen that the circuit of the third embodiment of FIG. 9A and the circuit of the fourth embodiment of FIG. 11 can also be adapted in a manner corresponding to the circuit of FIG. 7, so that the common mode component of an RF signal emitted from I/O port P2 will be substantially less than the differential mode component of the signal, while simultaneously matching the differential mode component of an arbitrary load impedance connected to I/O port P2 to a single-ended impedance connected to I/O port P1.

The invention claimed is:

1. A miniaturised half-wave balun having a given operating frequency and comprising:

a single-ended I/O port comprising a first signal carrying terminal for connection to a source impedance;

a differential I/O port comprising second and third signal carrying terminals for connection to a load impedance;

at least one transmission line comprising a first transmission line section and a second transmission line section of equal length and characteristic impedance, and wherein the length of said at least one transmission line is substantially less than one half of the wavelength of an RF signal at said operating frequency;

a first loading shunt capacitor connected to a first circuit node at a first end of said first transmission line section;

a second loading shunt capacitor connected to a second circuit node at a first end of said second transmission line section, said second ends of said first and said second transmission line sections being connected together at a third circuit node; and a shunt capacitive element connected at said third circuit node;

wherein said first signal carrying terminal is coupled to said first transmission line section, wherein said second signal carrying terminal is connected directly to said first circuit node and is connected to said first transmission line section at first circuit node, wherein said third signal carrying terminal is connected directly to said second circuit node and is connected to said second transmission line section at said second circuit node, and wherein the capacitance of said shunt capacitive element is chosen so that the common mode impedance of said differential I/O port at a selected frequency is substantially zero Ohms.

2. A miniaturised half-wave balun having a given operating frequency and comprising:

a single-ended I/O port comprising a first signal carrying terminal for connection to a source impedance;

a differential I/O port comprising second and third signal carrying terminals for connection to a load impedance;

at least one transmission line comprising a first transmission line section and a second transmission line section of equal length and characteristic impedance, and wherein the length of said at least one transmission line is substantially less than one half of the wavelength of an RF signal at said operating frequency;

a first loading shunt capacitor connected to a first circuit node at a first end of said first transmission line section, said first loading shunt capacitor having a capacitance $C_{A1}$;

a second loading shunt capacitor connected to a second circuit node at a first end of said second transmission line section, wherein the capacitance of said first loading shunt capacitor $C_{A1}$ is substantially equal to the capacitance of said second loading shunt capacitor $C_{A2}$, said second ends of said first and said second transmission line sections being connected together at a third circuit node; and a shunt capacitive element connected at said third circuit node, wherein the capacitance $C_B$ of said shunt capacitive element is substantially related to $C_{A1}$ and $C_{A2}$ by the equation:

$$C_{A1} = C_{A2} = \frac{C_B}{2};$$

wherein said first signal carrying terminal is coupled to said first transmission line section, wherein said second signal carrying terminal is connected to said first transmission line section at said first circuit node, wherein said third signal carrying terminal is connected to said second transmission line section at said second circuit node, and wherein the capacitance of said shunt capacitive element is chosen so that the common mode impedance of said differential I/O port at a selected frequency is substantially zero Ohms.

3. A miniaturised half-wave balun having a given operating frequency and comprising:

a single-ended I/O port comprising a first signal carrying terminal for connection to a source impedance;

a differential I/O port comprising second and third signal carrying terminals for connection to a load impedance;

at least one transmission line comprising a first transmission line section and a second transmission line section of equal length and characteristic impedance, and wherein the length of said at least one transmission line is substantially less than one half of the wavelength of an RF signal at said operating frequency;

a first loading shunt capacitor connected to a first circuit node at a first end of said first transmission line section;

a second loading shunt capacitor connected to a second circuit node at a first end of said second transmission line section, said second ends of said first and said second transmission line sections being connected together at a third circuit node; and a shunt capacitive element connected at said third circuit node, wherein the capacitance of said shunt capacitive element is chosen so that the common mode impedance of said differential I/O port at a selected frequency is substantially zero Ohms;

wherein said first signal carrying terminal is coupled to said first transmission line section, wherein the second signal carrying terminal is connected to said first transmission line section at a point along the first transmission line section between the first circuit node and the third circuit node and at a distance e from the first circuit node, and wherein the third signal carrying terminal is connected to said second transmission line section at a point along the second transmission line section between the second circuit node and the third circuit node and at a distance e from the second circuit node; and wherein a differential mode component $Z_{DL}$ of the load impedance is matched to the source impedance $Z_S$ approximately according to the equation:

$$Z_{DL} = \left[\frac{2(L-e)}{L}\right]^2 Z_S$$

where L is the electrical length of the first transmission line section and the second transmission line section.

4. A miniaturised half-wave balun according to claim 3 wherein the capacitance $C_{A1}$ of said first shunt capacitor, and the capacitance $C_{A2}$ of said second shunt capacitor are substantially given by the equation:

$$C_{A1} = C_{A2} = \frac{1}{\omega Z_0}\cot\left(\frac{2\pi}{\lambda}L\right)$$

and wherein the capacitance $C_B$ of said shunt capacitive element is substantially given by the equation:

$$C_B = \frac{2}{\omega Z_0}\cot\left[\frac{2\pi}{\lambda}(L-e)\right]$$

where $\omega$ is the angular frequency of an RF signal at said operating frequency $\lambda$ is the wavelength of that signal, and $Z_0$ is the characteristic impedance of said first transmission line section and said second transmission line section.

5. A coupled-line balun including a miniaturised half-wave balun according to claim 1 and further comprising:

a second transmission line comprising a third transmission line section and a fourth transmission line section of equal length and characteristic impedance to said first and second transmission line sections, each of said third and fourth transmission line sections being coupled to a respective one of said first and second transmission line sections, and said first signal carrying terminal being connected to said third transmission line section;

a third loading shunt capacitor connected to a further circuit node at a first end of said third transmission line section; and a fourth loading shunt capacitor connected to a still further circuit node at a first end of said fourth transmission line section.

6. A coupled-line balun including a miniaturised half-wave balun according to claim 1 comprising one or more mutually coupled transmission lines wherein said first signal carrying terminal is connected to one end of one of said mutually coupled transmission lines, one of said mutually coupled transmission lines being coupled to said first and second transmission line sections and each of said mutually coupled transmission lines having an electrical length substantially less than one half of the wavelength of an RF signal at said operating frequency.

7. A coupled-line balun according to claim 6 further comprising first and second feedback capacitors respectively connected between said first and second nodes and first and second ends of said one of said mutually coupled transmission lines to which said first signal carrying terminal is connected.

8. An acoustic resonator filter including a miniaturised half-wave balun according to claim 1 wherein said second and third terminals are connected to said first and second nodes through a lattice acoustic resonator network and wherein the miniaturised half-wave balun has an operating band which overlaps the passband of the lattice acoustic resonator network.

9. An acoustic resonator filter including a miniaturised half-wave balun according to claim 1 and further comprising a pair of ladder-type acoustic resonator filters connected between said first node and said second terminal and said second node and said third terminal respectively, wherein said ladder-type acoustic resonator filters have a common passband and said miniaturized half-wave balun has an operating band which overlaps said common passband of said ladder-type acoustic resonator filters.

* * * * *